United States Patent
Sakamoto

(10) Patent No.: US 12,446,412 B2
(45) Date of Patent: Oct. 14, 2025

(54) DISPLAY DEVICE AND PRODUCTION METHOD THEREOF

(71) Applicant: SHARP KABUSHIKI KAISHA, Osaka (JP)

(72) Inventor: Mayuko Sakamoto, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 821 days.

(21) Appl. No.: 17/280,131

(22) PCT Filed: Sep. 28, 2018

(86) PCT No.: PCT/JP2018/036285
§ 371 (c)(1),
(2) Date: Mar. 25, 2021

(87) PCT Pub. No.: WO2020/065922
PCT Pub. Date: Apr. 2, 2020

(65) Prior Publication Data
US 2022/0006049 A1 Jan. 6, 2022

(51) Int. Cl.
*H10K 59/124* (2023.01)
*H10K 50/84* (2023.01)
*H10K 50/844* (2023.01)
*H10K 59/131* (2023.01)
*H10K 59/80* (2023.01)

(52) U.S. Cl.
CPC ......... *H10K 59/124* (2023.02); *H10K 50/844* (2023.02); *H10K 50/846* (2023.02); *H10K 59/131* (2023.02); *H10K 59/873* (2023.02)

(58) Field of Classification Search
CPC .. H10K 50/844; H10K 50/846; H10K 59/131; H10K 2102/311; H10K 59/124; G09F 9/30; H05B 33/04
See application file for complete search history.

(56) References Cited

U.S. PATENT DOCUMENTS

| 2011/0007042 A1* | 1/2011 | Miyaguchi | H05K 1/028 345/204 |
| 2014/0319474 A1* | 10/2014 | Kim | H10K 50/8426 257/40 |
| 2014/0353670 A1 | 12/2014 | Youn et al. | |

(Continued)

FOREIGN PATENT DOCUMENTS

| JP | 2014232300 A | 12/2014 |
| JP | 2017187580 A | 10/2017 |

*Primary Examiner* — Fernando L Toledo
*Assistant Examiner* — Jahae Kim
(74) *Attorney, Agent, or Firm* — ScienBiziP, P.C.

(57) ABSTRACT

Between an end edge on a terminal side of a resin substrate layer in a frame region and a display region, an inorganic layered film is provided with a first opening penetrating the inorganic layered film and causing at least a part of an upper face of the resin substrate layer to be exposed, a first filling layer is provided in an interior of the first opening to cover an edge portion thereof, a plurality of lead wiring lines are provided to the end edge on the terminal side in contact with upper faces of the inorganic layered film and the first filling layer, extend in parallel to each other in a direction intersecting the end edge on the terminal side in the frame region, and are electrically connected to a plurality of terminals respectively.

11 Claims, 15 Drawing Sheets

(56) References Cited

U.S. PATENT DOCUMENTS

| | | | |
|---|---|---|---|
| 2015/0060786 A1 | 3/2015 | Kwak | |
| 2015/0287750 A1 | 10/2015 | Youn et al. | |
| 2016/0013253 A1 | 1/2016 | Lee | |
| 2017/0125505 A1* | 5/2017 | Oh | H10K 59/1213 |
| 2017/0162822 A1 | 6/2017 | Park et al. | |
| 2017/0194411 A1* | 7/2017 | Park | H10K 59/873 |
| 2017/0262109 A1 | 9/2017 | Choi et al. | |
| 2017/0288005 A1* | 10/2017 | Kawata | H01L 27/1218 |
| 2018/0040672 A1 | 2/2018 | Park et al. | |
| 2019/0333981 A1 | 10/2019 | Kawata | |
| 2020/0176549 A1 | 6/2020 | Kawata | |
| 2023/0337504 A1* | 10/2023 | Park | G06F 3/0443 |

\* cited by examiner

DISPLAY DEVICE AND PRODUCTION METHOD THEREOF

TECHNICAL FIELD

The disclosure relates to a display device and a manufacturing method of the same.

BACKGROUND ART

In recent years, self-luminous type organic electroluminescence (EL) display devices in which organic EL elements are used have attracted attention as a display device that can replace a liquid crystal display device. As the organic EL display device, a flexible organic EL display device that has flexibility and in which an organic EL element or the like is layered on a resin substrate having flexibility has been proposed. Here, in the organic EL display device, there are provided a rectangular display region for displaying an image and a frame region formed around the display region, and reduction of the frame region is demanded. Additionally, in the flexible organic EL display device, for example, when the frame region is reduced by bending the frame region positioned on the terminal side, the wiring line arranged in the frame region may be broken.

For example, Patent Literature (PTL) 1 discloses a flexible display device in which a bending hole is formed, and accordingly a part of each of a buffer film, a gate insulating film, and an interlayer insulating film corresponding to a bending region is removed and disconnection of a wiring line is prevented from occurring.

CITATION LIST

Patent Literature

PTL 1: JP 2014-232300 A

SUMMARY

Technical Problem

In a manufacturing process of a flexible organic EL display device, a mother substrate on which a plurality of organic EL display devices is arranged in a matrix is divided by laser light, and the organic EL display devices are individually cut out. Here, in the organic EL display device having flexibility, an inorganic insulating film such as a base coat film, a gate insulating film, an interlayer insulating film, and the like is provided on a resin substrate, and thus, when the mother substrate is divided by laser light, a crack may occur in the inorganic insulating film being present on an end face (end edge) of the cut-out organic EL display device, and this crack may progress to the display region. In this case, moisture, oxygen, or the like enters the interior of the display region from the crack, and as a result, there is a risk of poor display.

The disclosure has been contrived in consideration of the circumstances, an object of the disclosure is to suppress the occurrence or progress of a crack in an inorganic insulating film at an end edge of an organic EL display device.

Solution to Problem

To achieve the object described above, a display device according to the disclosure is a display device including a resin substrate, a TFT layer provided on the resin substrate and including at least one layer of an inorganic insulating film layered on the resin substrate, a light-emitting element configuring a display region provided on the TFT layer, a frame region provided around the display region, and a terminal portion provided at an end portion of the frame region and arrayed with a plurality of terminals, in which the frame region is provided with a plurality of lead wiring lines extending in parallel to one another in a direction intersecting an end edge on a terminal side of the resin substrate along the terminal portion and being electrically connected to the plurality of terminals respectively, between the end edge on the terminal side and the display region, the at least one layer of the inorganic insulating film is provided with a first opening penetrating the inorganic insulating film and causing at least a part of an upper face of the resin substrate to be exposed, a first filling layer is provided to cover an edge portion of the first opening in an interior of the first opening, and the plurality of lead wiring lines is provided up to the end edge on the terminal side in contact with upper faces of the at least one layer of the inorganic insulating film and the first filling layer.

Advantageous Effects of Disclosure

According to the disclosure, between the end edge on the terminal side and the display region, the at least one layer of the inorganic insulating film is provided with the first opening penetrating the inorganic insulating film and causing the at least the part of the upper face of the resin substrate to be exposed, and thus, it is possible to suppress the occurrence or progress of a crack in the inorganic insulating film at the end edge of the display device.

DESCRIPTION OF EMBODIMENTS

Embodiments of the disclosure will be described below in detail with reference to the drawings. Note that the disclosure is not limited to each embodiment to be described below.

First Embodiment

Figure 1:
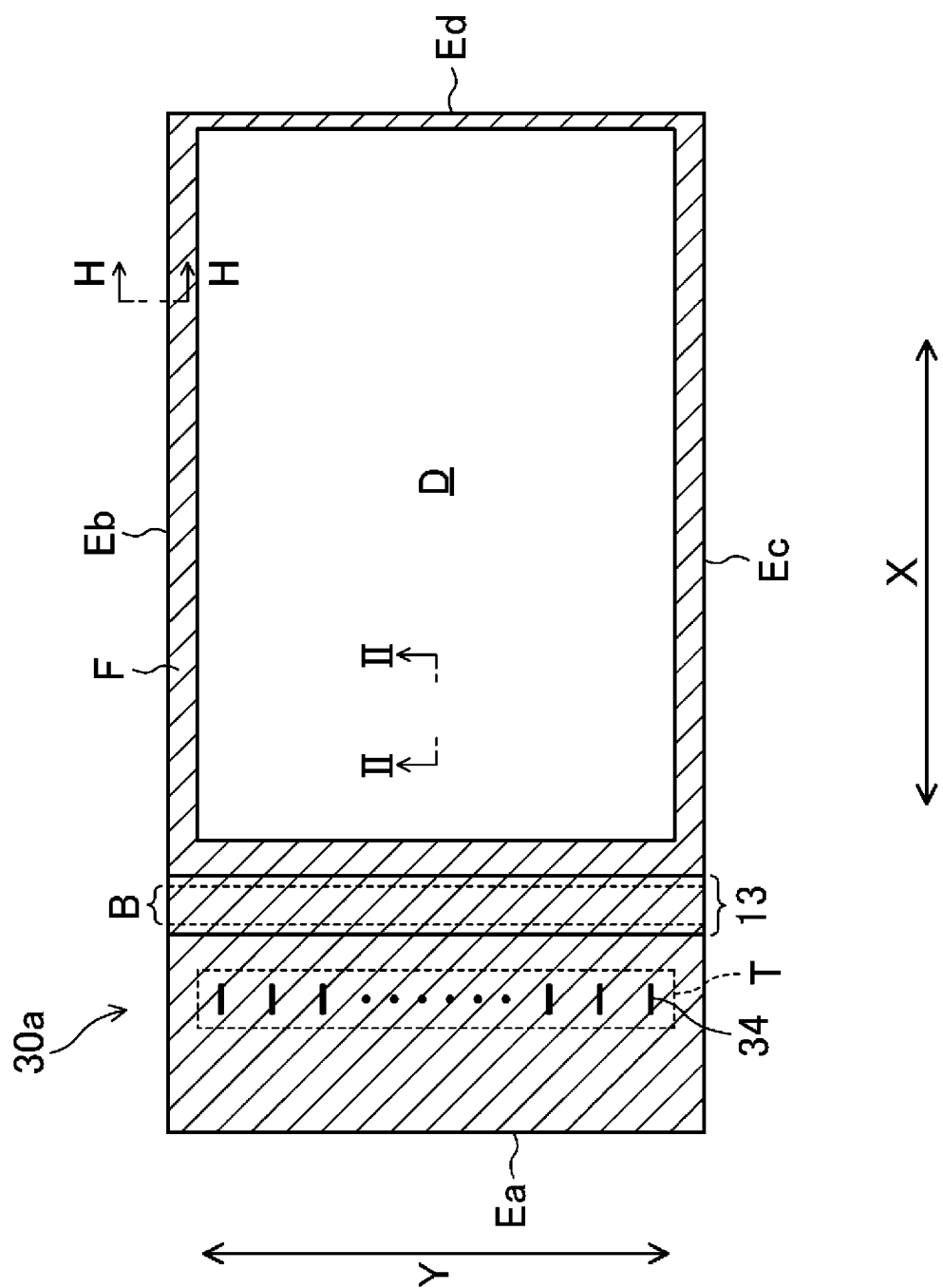
FIG. 1 is a plan view of an organic EL display device according to a first embodiment of the disclosure.
Figure 2:
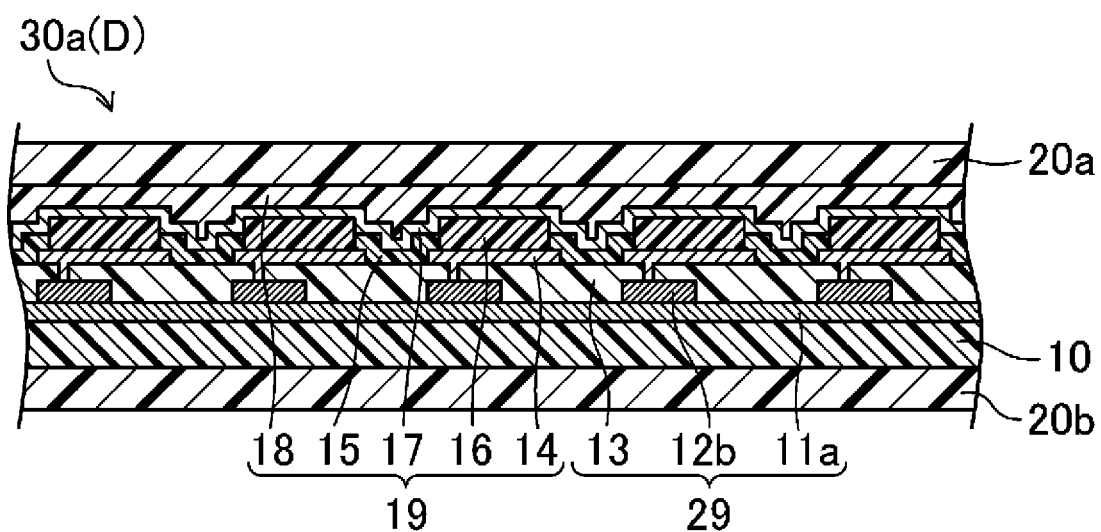
FIG. 2 is a cross-sectional view of the organic EL display device taken along a line II-II in FIG. 1.
Figure 3:
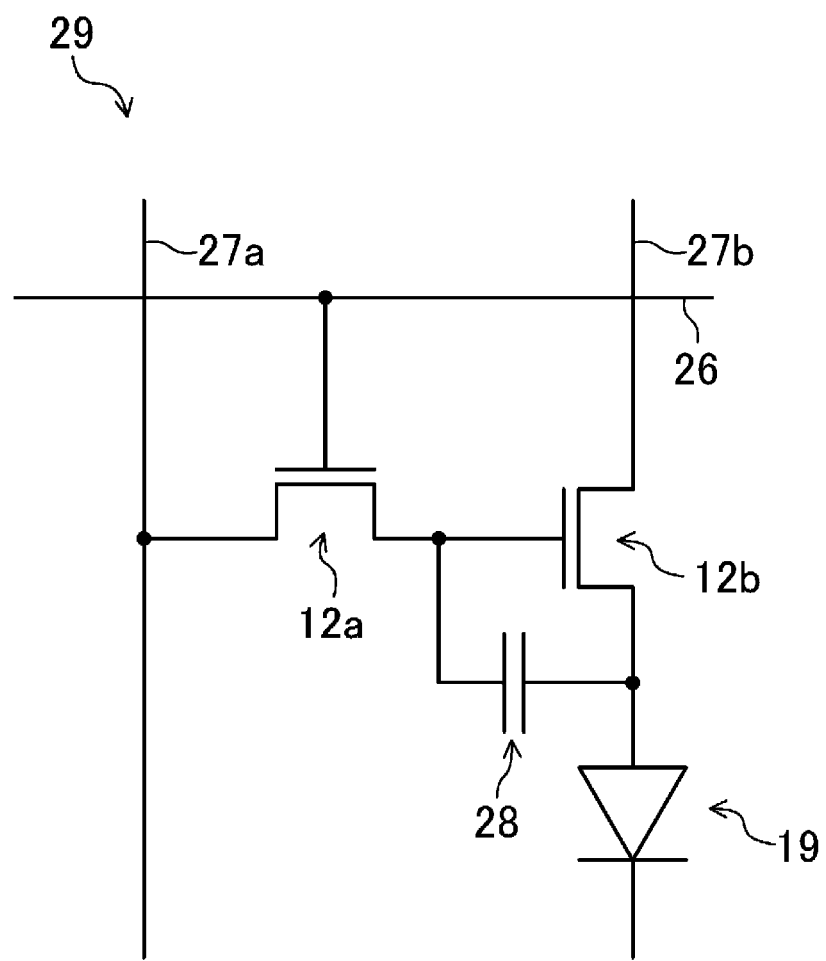
FIG. 3 is an equivalent circuit diagram illustrating a TFT layer included in the organic EL display device according to the first embodiment of the disclosure.
Figure 4:
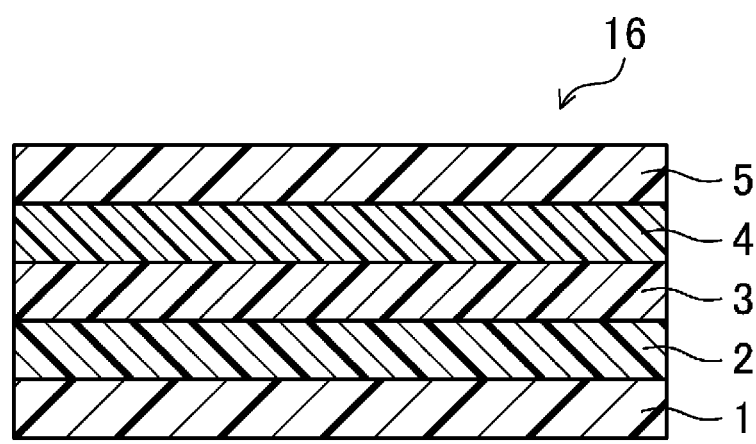
FIG. 4 is a cross-sectional view illustrating an organic EL layer included in the organic EL display device according to the first embodiment of the disclosure.
Figure 5:
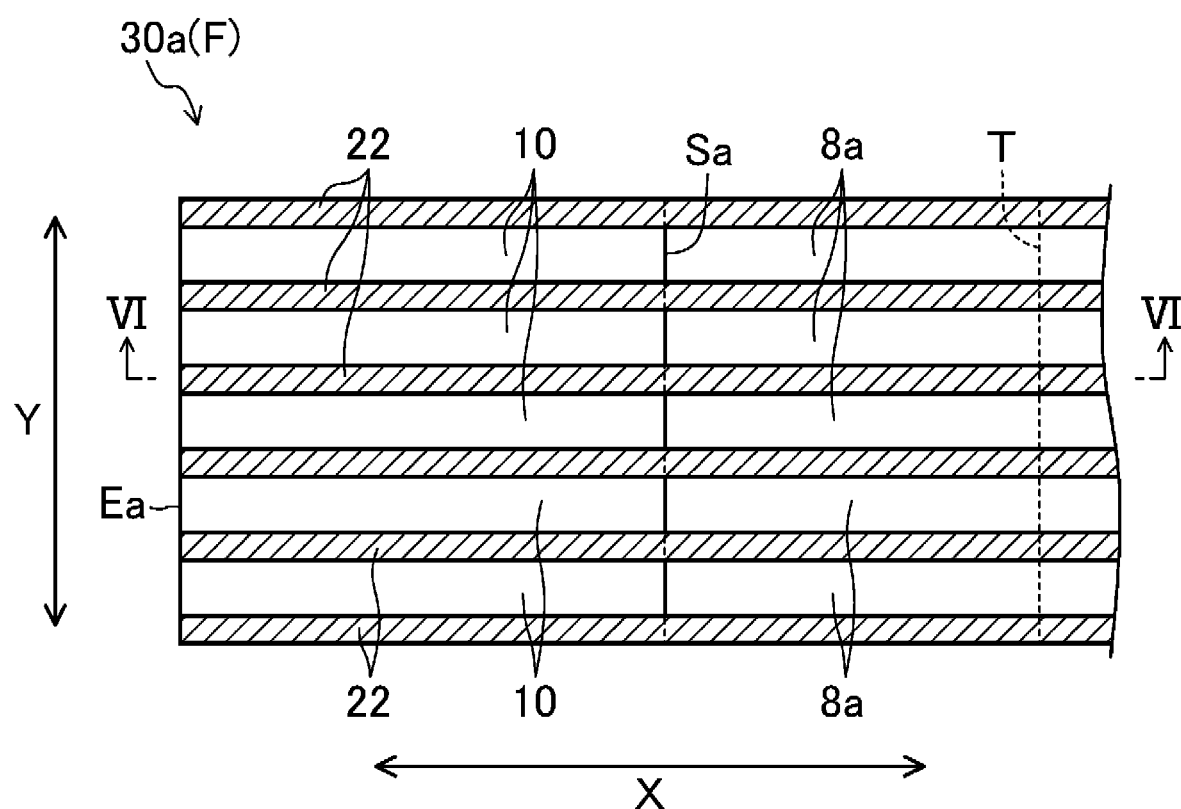
FIG. 5 is a plan view illustrating a region between a terminal portion and an end edge on a terminal side of a resin substrate in a frame region of the organic EL display device according to the first embodiment of the disclosure.
Figure 6:
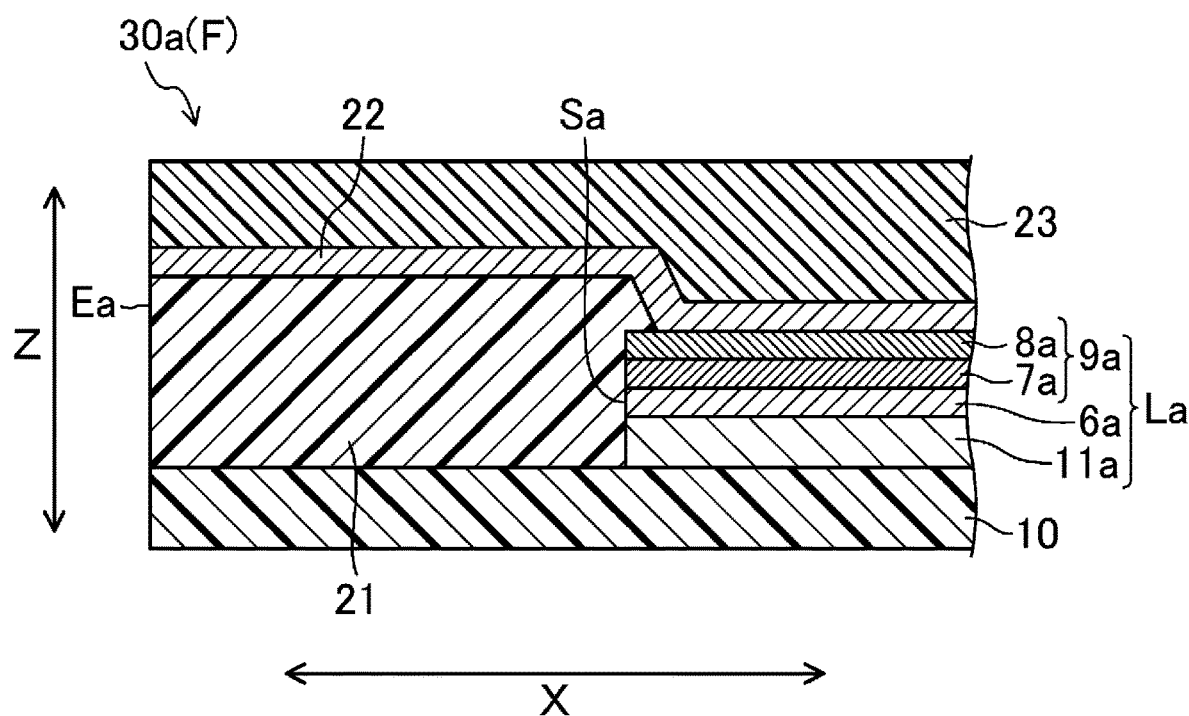
FIG. 6 is a cross-sectional view illustrating the region between the terminal portion and the end edge on the terminal side of the organic EL display device according to the first embodiment of the disclosure, and is the cross-sectional view taken along a line VI-VI in FIG. 5.

FIG. 1 to FIG. 6 illustrate a first embodiment of a display device according to the disclosure. Note that, in each of the following embodiments, an organic EL display device including an organic EL element will be exemplified as a display device including a light-emitting element. Here, FIG. 1 is a plan view of an organic EL display device 30a according to the present embodiment. Additionally, FIG. 2 is a cross-sectional view of the organic EL display device 30a taken along a line II-II in FIG. 1. Additionally, FIG. 3 is an equivalent circuit diagram of a TFT layer 29 included in the organic EL display device 30a. Additionally, FIG. 4 is a cross-sectional view of an organic EL layer 16 included in the organic EL display device 30a. Additionally, FIG. 5 is a plan view illustrating a region between a terminal portion T and an end edge Ea on a terminal side of a resin substrate layer 10 in a frame region F of the organic EL display device 30a. Additionally, FIG. 6 is a cross-sectional view illustrating the region between the terminal portion T and the end edge Ea on the terminal side of the organic EL display device 30a, and is the cross-sectional view taken along a line VI-VI in FIG. 5.

As illustrated in FIG. 1, the organic EL display device 30a includes a display region D defined to have a rectangular shape and configured to display an image, and the frame region F defined around the display region D (a hatched portion in the figure). Note that in the present embodiment, the display region D having the rectangular shape has been exemplified, but examples of the rectangular shape include a substantially rectangular shape such as a shape whose sides are arc-shaped, a shape whose corners are arc-shaped, a shape in which a part of a side has a notch and the like.

As illustrated in FIG. 2, the display region D is provided with an organic EL element 19 and a plurality of pixels arrayed in a matrix. Note that each of the pixels in the display region D includes, for example, a subpixel for display of red gray scale, a subpixel for display of green gray scale, and a subpixel for display of blue gray scale. These subpixels are arrayed adjacent to one another.

As illustrated in FIG. 1, the terminal portion T arrayed with a plurality of terminals 34 is provided at the left end portion of the frame region F in the figure. Further, as illustrated in FIG. 1, between the display region D and the terminal portion T in the frame region F, a bending portion B being bendable at 180 degrees (in a U shape) while taking a vertical direction in the figure as a bending axis, is provided along one side (left side in the figure) of the display region D.

As illustrated in FIG. 2, the organic EL display device 30a includes, in the display region D, the resin substrate layer 10, the TFT layer 29 provided on the resin substrate layer 10, the organic EL element 19 provided, as a light-emitting element, on the TFT layer 29, a front face side protection layer 20a provided on the organic EL element 19, and a rear face side protection layer 20b provided on the rear face of the resin substrate layer 10.

The resin substrate layer 10 is formed of, for example, an organic resin material, such as polyimide resin, acrylic resin, polysiloxane resin, or novolac resin, with a thickness of approximately from 10 μm to 20 μm, and is provided as a resin substrate.

As illustrated in FIG. 2, the TFT layer 29 includes a base coat film 11a provided on the resin substrate layer 10, a plurality of first TFTs 12a (see FIG. 3) and a plurality of second TFTs 12b provided on the base coat film 11a, and a TFT flattening film 13 provided on each of the first TFTs 12a and the second TFTs 12b. Here, as illustrated in FIG. 3, the TFT layer 29 is provided with a plurality of gate lines 26 extending in parallel to one another in a horizontal direction in the figure. In addition, as illustrated in FIG. 3, the TFT layer 29 is provided with a plurality of source lines 27a extending in parallel to one another in a vertical direction in the figure. Also, as illustrated in FIG. 3, the TFT layer 29 is provided with a plurality of power source lines 27b being adjacent to the corresponding source lines 27a and extending in parallel to one another in the vertical direction in the figure. In addition, as illustrated in FIG. 3, the TFT layer 29 is provided with, in each subpixel, the first TFT 12a, the second TFT 12b, and a capacitor 28.

The base coat film 11a is configured of, for example, a single layer film or a layered film of an inorganic insulating film made of, for example, silicon nitride, silicon oxide, silicon oxynitride, or the like.

As illustrated in FIG. 3, the first TFT 12a is connected to the corresponding gate line 26 and source line 27a in each subpixel. Additionally, as illustrated in FIG. 3, the second TFT 12b is connected to the corresponding first TFT 12a and power source line 27b in each subpixel. Here, each of the first TFT 12a and the second TFT 12b includes, for example, a semiconductor layer provided in an island shape on the base coat film 11a, a gate insulating film 6a (see FIG. 6) provided to cover the semiconductor layer, a gate electrode provided to overlap with a part of the semiconductor layer on the gate insulating film 6a, an interlayer insulating film 9a (see FIG. 6) provided to cover the gate electrode, and a source electrode and a drain electrode provided in a manner spaced apart from each other on the interlayer insulating film 9a. Note that, although in the present embodiment, the first TFT 12a and the second TFT 12b that are a top-gate type are exemplified, the first TFT 12a and the second TFT 12b that are a bottom-gate type may be applicable.

As illustrated in FIG. 3, the capacitor 28 is connected to the corresponding first TFT 12a and power source line 27b in each subpixel. Here, the capacitor 28 is configured of, for example, one electrode formed of an identical material in an identical layer to the gate electrode, the other electrode formed of an identical material in an identical layer to the source electrode and the drain electrode, and the interlayer insulating film 9a (see FIG. 6) provided between the pair of these electrodes.

The TFT flattening film 13 is formed of, for example, a colorless and transparent organic resin material such as polyimide resin.

As illustrated in FIG. 2, the organic EL element 19 includes a plurality of first electrodes 14, an edge cover 15, a plurality of organic EL layers 16, a second electrode 17, and a sealing film 18, which are provided on the TFT flattening film 13 in this order.

As illustrated in FIG. 2, the plurality of first electrodes 14 is provided, corresponding to a plurality of subpixels, in a matrix on the TFT flattening film 13. Here, as illustrated in FIG. 2, the first electrode 14 is connected to the drain electrode of the second TFT 12b through a contact hole formed in the TFT flattening film 13. Additionally, the first electrode 14 functions to inject holes into the organic EL layer 16. In addition, it is further preferable that the first electrode 14 be formed of a material having a large work function to improve the efficiency of hole injection into the organic EL layer 16. Here, examples of materials that constitute the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF) and the like. Moreover, examples of materials that constitute the first electrode 14 may include alloys such as magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), lithium fluoride (LiF)-calcium (Ca)-aluminum (Al) and the like. Furthermore, examples of materials that constitute the first electrode 14 may include electrically conductive oxides such as tin oxide (SnO), zinc oxide (ZnO), indium tin oxide (ITO), and indium zinc oxide (IZO). Additionally, the first electrode 14 may be formed by layering a plurality of layers formed of any of the above-mentioned materials. Note that, examples of materials having the large work function include indium tin oxide (ITO), indium zinc oxide (IZO) and the like.

As illustrated in FIG. 2, the edge cover 15 is provided in a lattice pattern to cover the peripheral portion of each first electrode 14. Here, examples of materials that constitute the edge cover 15 include an inorganic insulating film formed of, for example, silicon oxide ($SiO_2$), silicon nitride (SiNx (x is a positive number)) such as trisilicon tetranitride ($Si_3N_4$), silicon oxynitride (SiON), or the like, and an organic film formed of, for example, polyimide resin, acrylic resin, polysiloxane resin, novolac resin, or the like.

As illustrated in FIG. 2, the plurality of organic EL layers 16 is arranged on each of the first electrodes 14 and is provided in a matrix in such a manner as to correspond to the plurality of subpixels. Here, as illustrated in FIG. 4, each of the organic EL layers 16 includes a hole injection layer 1, a hole transport layer 2, a light-emitting layer 3, an electron transport layer 4, and an electron injection layer 5 which are provided on the first electrode 14 in this order.

The hole injection layer 1 is also referred to as an anode buffer layer, and functions to reduce the energy level difference between the first electrode 14 and the organic EL layer 16, to improve the efficiency of hole injection into the organic EL layer 16 from the first electrode 14. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, stilbene derivatives and the like.

The hole transport layer 2 functions to improve the efficiency of hole transport from the first electrode 14 to the organic EL layer 16. Here, examples of materials constituting the hole transport layer 2 include porphyrin derivatives, aromatic tertiary amine compounds, styrylamine derivatives, polyvinylcarbazole, poly-p-phenylenevinylene, poly silane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, zinc selenide and the like.

The light-emitting layer 3 is a region in which, when a voltage is applied via the first electrode 14 and the second electrode 17, holes and electrons are injected from the first electrode 14 and the second electrode 17 respectively, and the holes and the electrons recombine. Here, the light-emitting layer 3 is formed of a material having high light-emitting efficiency. Moreover, examples of materials constituting the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane and the like.

The electron transport layer 4 functions to facilitate migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, metal oxinoid compounds and the like, as organic compounds.

The electron injection layer 5 functions to reduce the energy level difference between the second electrode 17 and the organic EL layer 16, to improve the efficiency of electron injection into the organic EL layer 16 from the second electrode 17. Because of this function, the drive voltage for the organic EL element 19 can be reduced. Note that the electron injection layer 5 is also referred to as a cathode buffer layer. Here, examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), barium fluoride ($BaF_2$) and the like, aluminum oxide ($Al_2O_3$), strontium oxide (SrO) and the like.

As illustrated in FIG. 2, the second electrode 17 is disposed to cover the organic EL layers 16 and the edge cover 15. Additionally, the second electrode 17 functions to inject electrons into the organic EL layer 16. In addition, it is further preferable that the second electrode 17 include a material having a small work function to improve the efficiency of electron injection into the organic EL layer 16. Here, examples of materials that constitute the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), lithium fluoride (LiF) and the like. Additionally, the second electrode 17 may be formed of an alloy such as magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), lithium fluoride (LiF)-calcium (Ca)-aluminum (Al) and the like, for example. Additionally, the second electrode 17 may be formed of electrically conductive oxide, such as tin oxide (SnO), zinc oxide (ZnO), indium tin oxide (ITO), and indium zinc oxide (IZO). Moreover, the second electrode 17 may be formed by layering a plurality of layers formed of any of the above-mentioned materials. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), lithium fluoride (LiF)/calcium (Ca)/aluminum (Al) and the like.

As illustrated in FIG. 2, the sealing film 18 includes a first inorganic film provided to cover the second electrode 17, an organic film provided on the first inorganic film, and a second inorganic film provided to cover the organic film, and functions to protect the organic EL layer 16 from moisture, and oxygen. Here, the first inorganic film and the second inorganic film are formed of, for example, an inorganic material such as silicon oxide ($SiO_2$), aluminum oxide ($Al_2O_3$), silicon nitride (SiNx (x is a positive number)) such as trisilicon tetranitride ($Si_3N_4$), silicon carbonitride (SiCN), or the like. Further, the organic film described above is formed of, for example, an organic material such as acrylic resin, polyurea resin, parylene resin, polyimide resin, polyamide resin and the like.

The front face side protection layer 20a and the rear face side protection layer 20b are formed of, for example, polyimide resin or the like with a thickness of approximately 2 μm. Furthermore, a function film such as a touch panel layer, for example, may be included as the front face side protection layer 20a.

As illustrated in FIG. 5 and FIG. 6, the organic EL display device 30a includes, in the frame region F, the resin substrate layer 10, an inorganic layered film La and a first filling film 21 provided on the resin substrate layer 10, a plurality of lead wiring lines 22 (hatched portions in FIG. 5) provided on the inorganic layered film La and the first filling film 21, and a first flattening film 23 provided to cover the plurality of lead wiring lines 22. Note that, in the plan view of FIG. 5, the first filling film 21 and the first flattening film 23 are omitted.

The inorganic layered film La is at least one layer of an inorganic insulating film that constitutes the TFT layer 29. As illustrated in FIG. 6, the inorganic layered film La includes the base coat film 11a (first inorganic insulating film) serving as a moisture-proof film, the gate insulating film 6a (second inorganic insulating film), and the interlayer insulating film 9a formed of a first interlayer insulating film 7a (third inorganic insulating film) and a second interlayer insulating film 8a (fourth inorganic insulating film), which are layered on the resin substrate layer 10 in this order. That is, the inorganic layered film La is configured of four layers of inorganic insulating films.

Here, as illustrated in FIG. 5 and FIG. 6, in the organic EL display device 30a, between the end edge Ea on the terminal side of the resin substrate layer 10 along the terminal portion T and the display region D in the frame region F (see FIG. 1), the inorganic layered film La is provided with a first opening Sa that penetrates the inorganic layered film La to cause a certain region (at least a part) of the upper face of the resin substrate layer 10 to be exposed.

Specifically, the first opening Sa in which the base coat film 11a, the gate insulating film 6a, and the interlayer insulating film 9a of the inorganic layered film La are not provided is formed between the end edge Ea on the terminal side and the terminal portion T. As illustrated in FIG. 6, the first opening Sa is formed in such a manner as to penetrate the inorganic layered film La in a thickness direction Z thereof.

Additionally, as illustrated in FIG. 5 and FIG. 6, in the organic EL display device 30a, the first opening Sa is provided along the end edge Ea on the terminal side to the end edge Ea on the terminal side. In other words, the inorganic layered film La is not formed on the resin substrate layer 10 at the end edge Ea on the terminal side. That is, the inorganic layered film La is not present on the end edge Ea on the terminal side.

Also, as illustrated in FIG. 5, the first opening Sa is provided in a certain region extending along the end edge Ea on the terminal side from the end edge Ea on the terminal side toward the terminal portion T in an extending direction (direction X) of the lead wiring lines 22.

In this manner, in the organic EL display device 30a, the inorganic layered film La is provided at a certain distance separated from the end edge Ea on the terminal side.

As illustrated in FIG. 6, the first filling layer 21 is provided in an interior of the first opening Sa in such a manner as to cover an edge portion of the first opening Sa. Specifically, as illustrated in FIG. 5 and FIG. 6, the first filling layer 21 is provided to cover the upper face of the resin substrate layer 10 exposed at the first opening Sa and to fill the interior of the first opening Sa. Furthermore, at the end edge Ea on the terminal side, the upper face of the resin substrate layer 10 and the first filling layer 21 are in contact with each other. In other words, the first opening Sa is a through-hole that makes the upper face of the resin substrate layer 10 and the first filling layer 21 be in contact with each other at the end edge Ea on the terminal side.

As illustrated in FIG. 5, the plurality of (six in FIG. 5) lead wiring lines 22 extends in parallel to each other to the terminal portion T in a direction intersecting the end edge Ea on the terminal side (direction X in FIG. 5) in the frame region F, and is electrically connected to the plurality of terminals 34 disposed on the terminal portion T respectively.

Also, as illustrated in FIG. 5 and FIG. 6, between the end edge Ea on the terminal side and the display region D, the lead wiring lines 22 are provided to the end edge Ea on the terminal side in contact with the upper faces of the inorganic layered film La (specifically, the second interlayer insulating film 8a) and the first filling layer 21.

The lead wiring line 22 is configured of, for example, a metal layered film of a titanium film (with a thickness of approximately 200 nm)/an aluminum film (with a thickness of approximately 100 nm)/a titanium film (with a thickness of approximately 200 nm), or the like. Note that, although in the present embodiment, the example of the lead wiring line 22 configured of a metal layered film is given, the lead wiring line 22 may also be configured of a metal single layer film. Furthermore, the lead wiring line 22 may be constituted by an identical material to the source line 27a. Further, the lead wiring line 22 may be formed in an identical layer by using an identical material to the terminal 34.

As illustrated in FIG. 6, the first flattening film 23 is provided on the plurality of lead wiring lines 22 in contact with the plurality of lead wiring lines 22. Specifically, the first flattening film 23 is provided to cover the second interlayer insulating film 8a and the plurality of lead wiring lines 22 of the inorganic layered film La, and the upper face of the second interlayer insulating film 8a, the plurality of lead wiring lines 22 and the first flattening film 23 are in contact with one another.

Each of the first filling film 21 and the first flattening film 23 is configured of, for example, an organic insulating film made of polyimide resin, or the like with a thickness of approximately 2 μm. Specifically, the first flattening film 23 is provided in an identical layer by using an identical material to the edge cover 15 included in the organic EL element 19.

The organic EL display device 30a described above has flexibility, and is configured, in each subpixel, such that the light-emitting layer 3 of the organic EL layer 16 is caused to appropriately emit light via the first TFT 12a and the second TFT 12b so that images are displayed.

The organic EL display device 30a of the present embodiment can be manufactured as will be described below.

For example, first, the organic EL display device 30a can be manufactured such that the TFT layer 29 and the organic EL element 19 are formed, by using a well-known method, on the resin substrate layer 10 formed on a glass substrate, the front face side protection layer 20a is bonded on the organic EL element 19 with an adhesive layer interposed therebetween, and then the rear face side protection layer 20b is bonded to the rear face of the resin substrate layer 10 from which the glass substrate has been peeled off, with an adhesive layer interposed therebetween.

Here, the organic EL display device 30a can be manufactured by forming the first opening Sa in the inorganic layered film La between the end edge Ea on the terminal side and the display region D, forming the first filling layer 21 in the interior of the first opening Sa in such a manner as to cover the edge portion of the first opening Sa, and forming, in the frame region F, the plurality of lead wiring lines 22 extending to the end edge Ea on the terminal side in contact with the upper faces of the inorganic layered film La and the first filling layer 21.

Specifically, before the formation of the source electrode and the drain electrode of the TFT 12 included in the organic EL element 19, the first opening Sa is formed by forming and patterning the inorganic layered film La only between the end edge Ea on the terminal side and the display region D. Before the formation of the source electrode and the drain electrode of the TFT 12, the first filling layer 21 is formed by forming and patterning a photosensitive organic insulating film using polyimide resin, or the like in the interior of the first opening. The plurality of lead wiring lines 22 is formed when the source electrode and the drain electrode of the TFT 12 are formed.

By dividing, by laser light, a mother substrate in which the organic EL display devices 30a manufactured by the above-described process are arranged in a matrix, a single organic EL display device 30a can be obtained. Here, in the mother substrate, the lead wiring lines 22 of each organic EL display device 30a are electrically connected to a short ring (antistatic short circuit wiring line).

Note that the configuration described above in the organic EL display device 30a is not limited between the end edge Ea on the terminal side and the display region D, and can be also provided between an end edge Eb, Ec, or Ed, which is not on the terminal side, other than the end edge Ea on the terminal side illustrated in FIG. 1 and the display region D. In addition, even when the configuration is not provided on all four circumferential end edges of the display device, for example, in a case of a substantially rectangular display region D in which there is a notch in a part of a side, the configuration may be provided only in a recessed portion, such as the notch portion, where a crack is likely to occur.

As described above, according to the organic EL display device 30a of the present embodiment, the first opening Sa is provided in the inorganic layered film La between the end edge Ea on the terminal side and the display region D, and penetrates the inorganic layered film La to cause a certain region on the upper face of the resin substrate layer 10 to be exposed. The first opening Sa is provided along the end edge Ea on the terminal side to the end edge Ea on the terminal side, so the inorganic layered film La is not present on the end edge Ea on the terminal side. Thus, since the inorganic layered film La is provided at a certain distance separated from the end edge Ea on the terminal side, the occurrence of a crack in the inorganic layered film La at the end edge Ea on the terminal side can be suppressed, and poor display can be prevented from occurring.

In addition, according to the organic EL display device 30a of the present embodiment, since the upper face of the resin substrate layer 10 and the first filling layer 21 are in contact with each other at the end edge Ea on the terminal side, the end edge Ea on the terminal side is reinforced. Therefore, the occurrence of a crack in the inorganic layered film La at the end edge Ea on the terminal side can be further suppressed.

Second Embodiment

Figure 7:
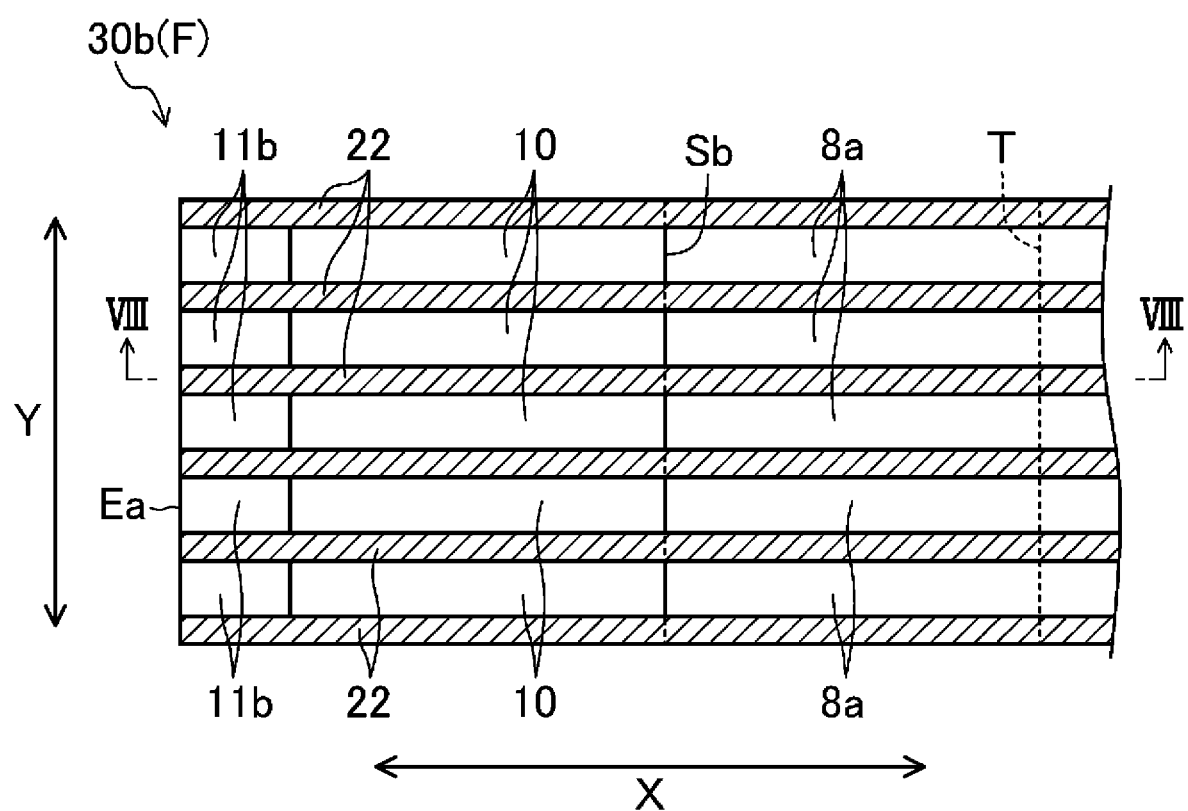
FIG. 7 is a plan view illustrating a region between a terminal portion and an end edge on a terminal side of an organic EL display device according to a second embodiment of the disclosure, and is a diagram corresponding to FIG. 5.
Figure 8:
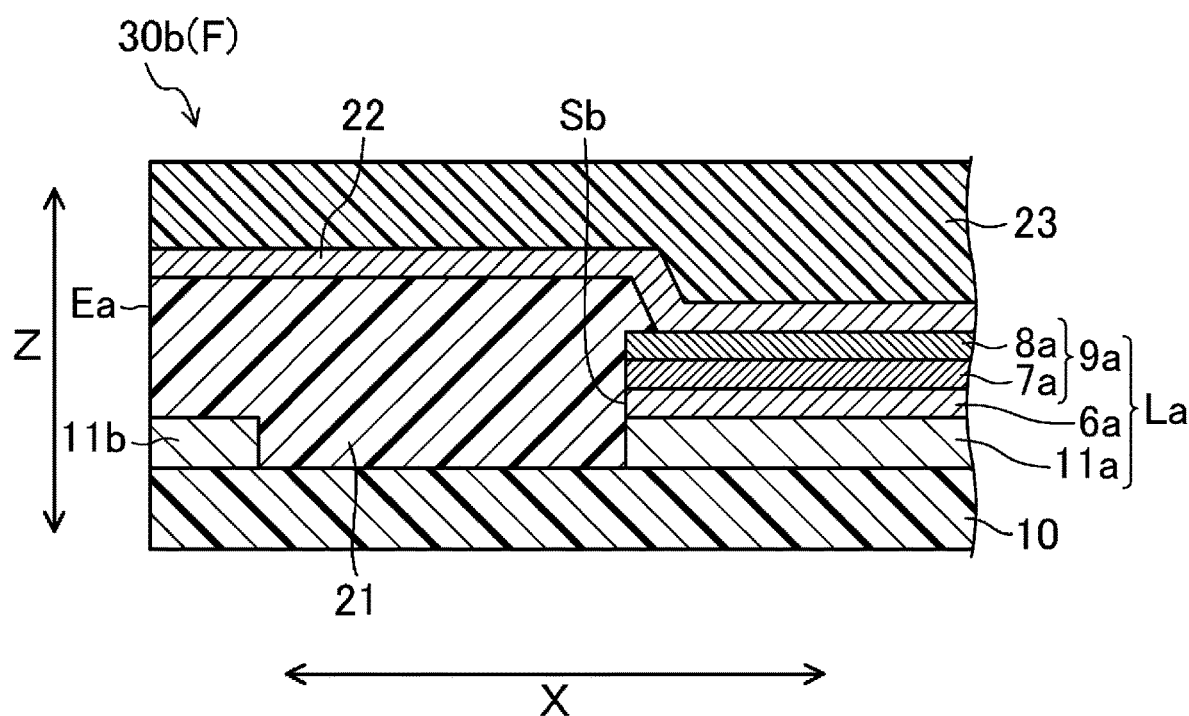
FIG. 8 is a cross-sectional view, which is taken along a line VIII-VIII in FIG. 7, of the region between the terminal portion and the end edge on the terminal side of the organic EL display device according to the second embodiment of the disclosure, and is a diagram corresponding to FIG. 6.

A second embodiment of the disclosure will be described below. FIG. 7 is a plan view illustrating a region between the end edge Ea on the terminal side and the terminal portion T of an organic EL display device 30b according to the present embodiment, and is a diagram corresponding to FIG. 5. Additionally, FIG. 8 is a cross-sectional view, which is taken along a line VIII-VIII in FIG. 7, illustrating the region between the end edge Ea on the terminal side and the terminal portion T of the organic EL display device 30b, and is a diagram corresponding to FIG. 6. Note that an overall configuration, of the organic EL display device 30b, including the display region D, the frame region F, and the like, other than the region between the end edge Ea on the terminal side and the display region D, is identical to that of the first embodiment described above, and thus, detailed description thereof will be omitted here. Note that constituent portions similar to those in the first embodiment described above are denoted by the identical reference signs, and description thereof will be omitted.

Although in the first embodiment described above, the example of the organic EL display device 30a in which the inorganic layered film La is not present in the end edge Ea on the terminal side is given, an example of the organic EL display device 30b in which a base coat film 11b is provided on the resin substrate layer 10 is given in the present embodiment.

In the organic EL display device 30b, as illustrated in FIG. 7 and FIG. 8, the base coat film 11b is provided between the resin substrate layer 10 and the first filling layer 21 at the end edge Ea on the terminal side. Note that in the plan view of FIG. 7, the first filling layer 21 and the first flattening film 23 are omitted.

Specifically, as illustrated in FIG. 7 and FIG. 8, in a first opening portion Sb, the base coat film 11b is layered on the exposed resin substrate layer 10 at a predetermined interval with the inorganic layered film La, and the first filling layer 21 is provided to cover the upper face of the base coat film 11b. As illustrated in FIG. 7 and FIG. 8, the base coat film 11b is provided along the end edge Ea on the terminal side to the end edge Ea on the terminal side.

Thus, as illustrated in FIG. 7 and FIG. 8, in the organic EL display device 30b, the base coat film 11b is separated from the base coat film 11a of the inorganic layered film La by the first opening Sb.

Note that, in a case of a top-gate type TFT in the organic EL display device 30b, a semiconductor layer, for example, formed of the identical material in the identical layer to the semiconductor layer of the first TFT 12a included in the TFT layer 29 may be provided between the base coat film 11b and the first filling layer 21 at the end edge Ea on the terminal side.

Alternatively, in a case of a bottom gate type TFT, a gate layer, for example, formed of the identical material in the identical layer to the gate electrode of the first TFT 12a included in the TFT layer 29, may be provided between the base coat film 11b and the first filling layer 21 at the end edge Ea on the terminal side.

In these cases, since the semiconductor layer or the gate layer functions as a stopper for etching the base coat film 11b, the base coat film 11b can be provided without separately forming a resist on the inorganic layered film.

The organic EL display device 30b of the present embodiment can be manufactured by modifying a pattern shape of the inorganic layered film La in the manufacturing method of the organic EL display device 30a of the above-described first embodiment.

Note that the configuration described above in the organic EL display device 30b is not limited between the end edge Ea on the terminal side and the display region D, and may be provided between the end edge Eb, Ec, or Ed not being on the terminal side and the display region D. In addition, even when the configuration is not provided on all four circumferential end edges of the display device, for example, in a case of a substantially rectangular display region D in which there is a notch in a part of a side, the configuration may be provided only in a recessed portion, such as the notch portion, where a crack is likely to occur.

According to the organic EL display device 30b of the present embodiment described above, the base coat film 11b is provided between the resin substrate layer 10 and the first filling layer 21 at the end edge Ea on the terminal side. Since the base coat film 11b is separated from the base coat film 11a of the inorganic layered film La by the first opening Sb, even when a crack occurs in the base coat film 11b at the end edge Ea on the terminal side, the progress of the crack to the display region D can be suppressed, and poor display can be prevented from occurring.

In addition, according to the organic EL display device 30b of the present embodiment, the first filling layer 21 is provided to cover the upper face of the base coat film 11b, and thus the base coat film 11b at the end edge Ea on the terminal side is reinforced. Therefore, the occurrence of a crack in the base coat film 11b at the end edge Ea on the terminal side can be suppressed.

Furthermore, according to the organic EL display device 30b of the present embodiment, the base coat film 11b is provided on the resin substrate layer 10 at the end edge Ea on the terminal side, and thus, the permeation of moisture, oxygen, and the like from the end edge Ea on the terminal side to the interior of the display region D can be suppressed.

Third Embodiment

Figure 9:
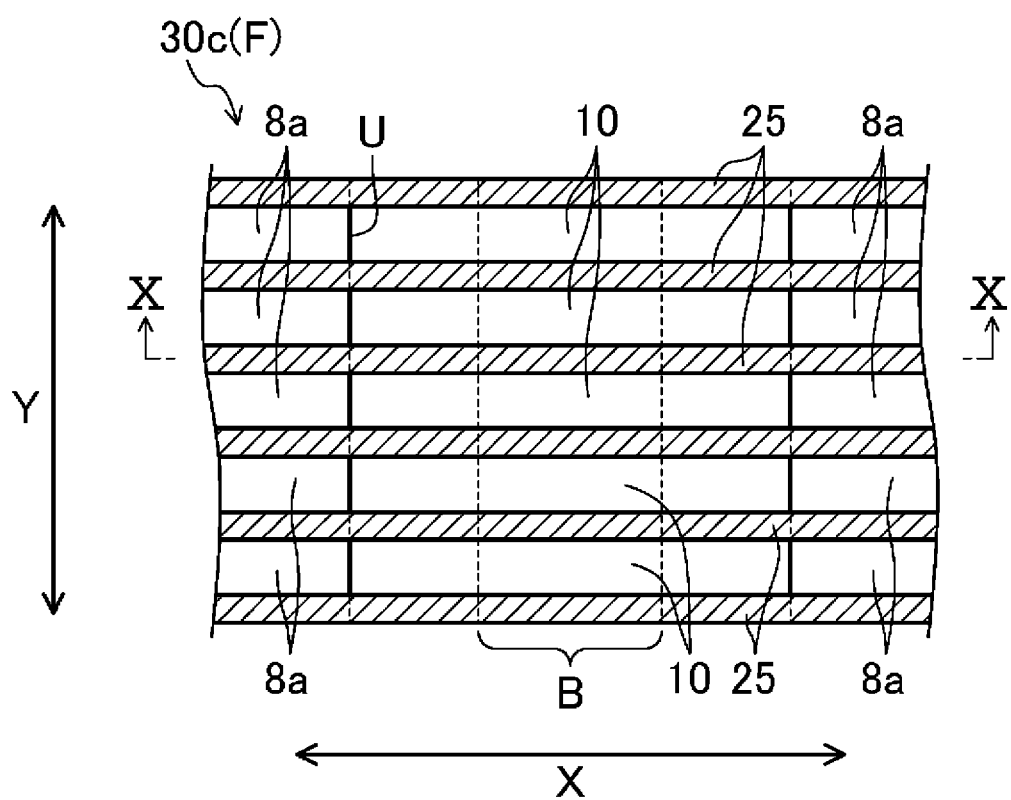
FIG. 9 is a plan view illustrating a bending portion in a frame region of an organic EL display device according to a third embodiment of the disclosure.
Figure 10:
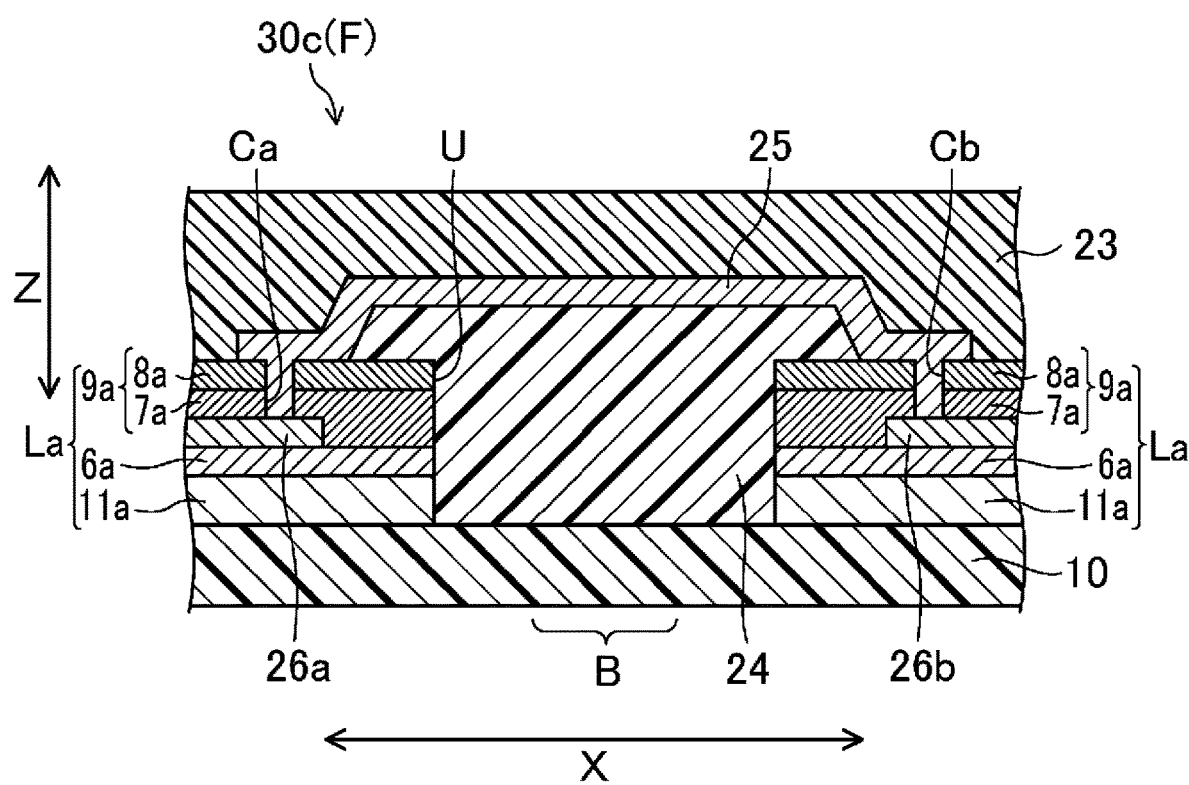
FIG. 10 is a cross-sectional view illustrating a bending portion of the organic EL display device according to the third embodiment of the disclosure, and is the cross-sectional view taken along a line X-X in FIG. 9.

A third embodiment of the disclosure will be described below. FIG. 9 is a plan view illustrating the bending portion B in the frame region F of an organic EL display device 30c according to the present embodiment. Also, FIG. 10 is a cross-sectional view illustrating the bending portion B of the organic EL display device 30c, and is the cross-sectional view taken along a line X-X in FIG. 9. Note that an overall configuration, of the organic EL display device 30c, including the display region D, the frame region F, and the like, other than the bending portion B, is identical to that of the first embodiment described above, and thus, detailed description thereof will be omitted. Note that constituent portions similar to those in the first embodiment described above are denoted by the identical reference signs, and description thereof will be omitted.

In the first embodiment and the second embodiment described above, the organic EL display devices 30a and 30b in which the first opening Sa or Sb is provided between the end edge Ea on the terminal side and the display region D have been exemplified, but in the present embodiment, the organic EL display device 30c in which a slit U is provided in the bending portion B is exemplified.

In the organic EL display device 30c, as illustrated in FIG. 1, the bending portion B is provided between the end edge Ea on the terminal side and the display region D in the frame region F in such a manner as to extend in one direction (a direction Y in FIG. 1) between the display region D and the terminal portion T.

As illustrated in FIG. 9 and FIG. 10, the organic EL display device 30c includes, in the bending portion B, the resin substrate layer 10, the inorganic layered film La and a second filling layer 24 that are provided on the resin substrate layer 10, a plurality of frame wiring lines 25 provided on the inorganic layered film La and the second filling film 24 (hatched portions in FIG. 9), and the first flattening film 23 provided to cover the plurality of frame wiring lines 25. Note that in the plan view in FIG. 9, the first flattening film 23 and the second filling layer 24 are omitted.

Here, as illustrated in FIG. 9 and FIG. 10, in the organic EL display device 30c, the inorganic layered film La is provided with, in the bending portion B, the slit U penetrating the inorganic layered film La to cause the upper face of the resin substrate layer 10 to be exposed.

Specifically, in the bending portion B, the slit U is formed in which the base coat film 11a, the gate insulating film 6a, and the interlayer insulating film 9a of the inorganic layered film La are not provided. As illustrated in FIG. 10, the slit U is formed by penetrating the inorganic layered film La in a thickness direction Z thereof.

Also, in the organic EL display device 30c, as illustrated in FIG. 9 and FIG. 10, the slit U is provided along an extending direction of the bending portion B (direction Y in FIG. 9), that is, to both end edges (both ends in the direction Y) of the bending portion B. In other words, the inorganic layered film La is not formed on the resin substrate layer 10 in the slit U of the bending portion B. That is, the inorganic layered film La is not present in the slit U.

In this manner, in the organic EL display device 30c, the inorganic layered film La is separated by the slit U in the bending portion B.

As illustrated in FIG. 10, the second filling layer 24 is provided in an interior of the slit U in such a manner as to cover an edge portion of the slit U. Specifically, as illustrated in FIG. 10, the second filling layer 24 is provided to cover the upper face of the resin substrate layer 10 exposed at the slit U, and to fill the interior of the slit U. Furthermore, at the end edge Ea on the terminal side, the upper face of the resin substrate layer 10 and the second filling layer 24 are in contact with each other. In other words, the slit U is a through-hole that causes the upper face of the resin substrate layer 10 and the second filling layer 24 to be directly in contact with each other in the bending portion B. In addition, the second filling layer 24 is formed of the identical material in the identical layer to those of the first filling layer 21.

As illustrated in FIG. 9, the plurality (six in FIG. 9) of frame wiring lines 25 is provided in the bending portion B in such a manner as to extend in parallel to each other in a direction (direction X in FIG. 9) intersecting an extending direction (direction Y in FIG. 9) of the bending portion B. Furthermore, the plurality of frame wiring lines 25 is electrically connected to a plurality of display wiring lines (gate lines 26, source lines 27a, power source lines 27b, and the like) respectively, illustrated in FIG. 3 and the plurality of terminals 34 that are provided to extend in parallel to one another in a direction intersecting the extending direction of the bending portion B provided in the display region D.

Specifically, as illustrated in FIG. 10, both end portions of the frame wiring line 25 are connected to the first gate conductive layer 26a and a second gate conductive layer 26b respectively via contact holes Ca and Cb formed in the first interlayer insulating film 7a and the second interlayer insulating film 8a. Then, the first gate conductive layer 26a is connected to the terminals 34, and the second gate conductive layer 26b is connected to the display wiring lines described above. Note that, although in the present embodiment, the example of the frame wiring lines 25 connected to the first gate conductive layer 26a and the second gate conductive layer 26b is given, the frame wiring lines 25 may be connected to a conductive layer of another layer.

In addition, as illustrated in FIG. 10, the frame wiring lines 25 are provided in the bending portion B in contact with the upper faces of the inorganic layered film La (specifically, the second interlayer insulating film 8a) and the second filling layer 24.

The frame wiring lines 25 are provided in the identical layer by using the identical material to the lead wiring lines 22. Note that, although an example of the frame wiring lines 25 configured of a metal layered film is given in this embodiment, the frame wiring lines 25 may also be configured of a metal single layer film.

As illustrated in FIG. 10, the first flattening film 23 is provided on the plurality of frame wiring lines 25 in contact with the plurality of frame wiring lines 25. Specifically, the first flattening film 23 is provided to cover the upper face of the second interlayer insulating film 8a of the inorganic layered film La and the plurality of frame wiring lines 25, and each of the upper face of the second interlayer insulating film 8a and the plurality of frame wiring lines 25, and the first flattening film 23 are in contact with one another.

Note that the front face side protection layer 20a and the rear face side protection layer 20b which are disposed in the display region D are also provided in the most part of the frame region F, but are not provided in the bending portion B.

Note that the organic EL display device 30c of the present embodiment can be manufactured by modifying the pattern shape of the inorganic layered film La in the bending portion B in the manufacturing method of the organic EL display device 30a of the first embodiment described above.

As described above, according to the organic EL display device 30c of the present embodiment, in addition to the effects of the organic EL display device 30a or 30b of the first or second embodiment described above, in the bending portion B, since the inorganic layered film La is separated by the slit U, the progress of a crack into the display region D can be further suppressed, and poor display can be further prevented from occurring.

Fourth Embodiment

Figure 11:
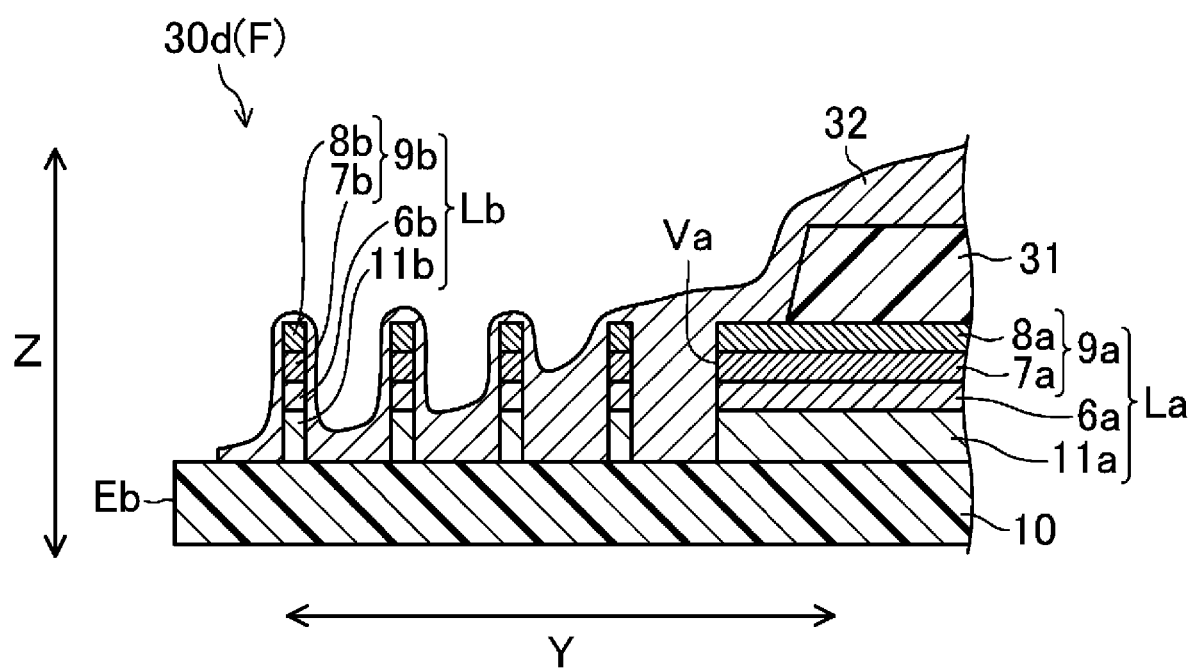
FIG. 11 is a cross-sectional view illustrating a region between a display region and an end edge not being on a terminal side of a resin substrate in a frame region of an organic EL display device according to a fourth embodiment of the disclosure, and is the cross-sectional view taken along a line H-H in FIG. 1.

A fourth embodiment of the disclosure will be described below. FIG. 11 is a cross-sectional view illustrating a region between the end edge Eb not being on the terminal side of the resin substrate layer 10 and the display region D in the frame region F of an organic EL display device 30d according to the present embodiment, and is the cross-sectional view taken along a line H-H in FIG. 1. Note that an overall configuration, of the organic EL display device 30d, including the display region D, the frame region F, and the like, other than a region between the end edge Eb, Ec, or Ed not being on the terminal side and the display region D, is identical to that of the first embodiment described above, and thus, detailed description thereof will be omitted. Note that constituent portions similar to those in the first embodiment described above are denoted by the identical reference signs, and description thereof will be omitted.

As illustrated in FIG. 1, the end edges Eb and Ec not being on the terminal side represent respective end edges that intersect with the end edge Ea on the terminal side in the frame region F. Furthermore, as illustrated in FIG. 1, the end edge Ed not being on the terminal side indicates an end edge that faces the end edge Ea on the terminal side.

In the present embodiment, the organic EL display device 30d is illustrated as a modified example of the configuration between the end edge Eb, Ec, or Ed not being on the terminal side and the display region D. Note that a configuration, which will be described below, of the organic EL display device 30d may be provided between all of the end edges Eb, Ec, and Ed not being on the terminal side and the display region D, and in a case of a substantially rectangular display region D having a notch in a part of the side thereof, the configuration may be provided only in a recessed portion, such as the notch portion, where a crack is likely to occur. In the following description, a configuration between the end edge Eb not being on the terminal side and the display region D will be described as an example.

As illustrated in FIG. 11, the organic EL display device 30d includes, between the end edge Eb not being on the terminal side other than the end edge Ea on the terminal side and the display region D, the resin substrate layer 10, the inorganic layered film La and residual layers Lb thereof provided on the resin substrate layer 10, the second flattening film 31 provided on the inorganic layered film La, and a layered film 32 of the first inorganic film and the second inorganic film that configure the sealing film 18 provided to cover the upper face of the resin substrate layer 10, the inorganic layered film La, the residual layers Lb, and the second flattening film 31.

Here, in the organic EL display device 30d, as illustrated in FIG. 11, the inorganic layered film La is provided with a plurality of second openings Va that is provided to be spaced apart from each other between the end edge Eb not being on the terminal side and the display region D, and that penetrates the inorganic layered film La to cause at least a part of the upper face of the resin substrate layer 10 to be exposed.

Specifically, the plurality of second openings Va is formed between the end edge Eb not being on the terminal side and the display region D without providing the base coat film 11a, the gate insulating film 6a, and the interlayer insulating film 9a of the inorganic layered film La. As illustrated in FIG. 11, the second opening Va is formed by penetrating the inorganic layered film La in a thickness direction Z thereof.

Moreover, as illustrated in FIG. 11, each of a plurality of the residual layers Lb of the inorganic layered film La is provided in a slit shape along the end edge Eb not being on the terminal side between the second openings Va adjacent to each other among the plurality of second openings Va.

Also, in the organic EL display device 30d, as illustrated in FIG. 11, the second opening Va on a side of the end edge Eb not being on the terminal side among the plurality of second openings Va is provided along the end edge Eb not being on the terminal side to the end edge Eb not being on the terminal side. In other words, no residual layer Lb is formed on the resin substrate layer 10 at the end edge Eb not being on the terminal side. That is, there is no residual layer Lb at the end edge Eb not being on the terminal side.

As described above, in the organic EL display device 30d, the residual layer Lb is provided at a certain distance separated from the end edge Eb not being on the terminal side.

On the other hand, the second flattening film 31 is provided on the inorganic layered film La on a side closer to the display region D than the plurality of second openings Va. The second flattening film 31 is configured of, for example, an organic insulating film made of polyimide resin or the like with a thickness of approximately 2 µm.

The layered film 32 is provided to cover the organic EL element 19. Specifically, as illustrated in FIG. 11, the layered film 32 is provided to cover the upper face of the resin substrate layer 10, edge portions of the plurality of second openings Va, the inorganic layered film La, the residual layers Lb, and the second flattening film 31.

In this manner, the layered film 32 is provided to cover edge portions of the plurality of residual layers Lb that are separated from one another, and thus, thick portions and thin portions are formed in the layered film 32. Since the thin portion causes the layered film 32 to be easily separated, even when a crack occurs in the layered film 32 at the end edge Eb not being on the terminal side, the progress of the crack into the display region D can be suppressed.

In addition, in the organic EL display device 30d, as illustrated in FIG. 11, the layered film 32 is not provided on the resin substrate layer 10 at the end edge Eb not being on the terminal side. In other words, the layered film 32 is not present at the end edge Eb not being on the terminal side. Note that at the end edge Eb not being on the terminal side, the layered film 32 may be provided on the resin substrate layer 10 in such a manner as to have a thickness being thinner than that of one layer of the inorganic layered film La (for example, the base coat film 11a, or the like).

The organic EL display device 30d of the present embodiment can be manufactured by modifying the pattern shape of the inorganic layered film La in the end edge Eb not being on the terminal side and the display region D in the manufacturing method of the organic EL display device 30a of the first embodiment.

As described above, according to the organic EL display device 30d of the present embodiment, the inorganic layered film La is provided with the plurality of second openings Va that is separated from one another between the end edge Eb not being on the terminal side and the display region D, and that penetrates the inorganic layered film La to cause at least a part of the upper face of the resin substrate layer 10 to be exposed. Among the plurality of second openings Va, the second opening Va on a side of the end edge Eb not being on the terminal side is provided to the end edge Eb on the terminal side along the end edge Eb on the terminal side, and thus, the residual layer Lb of the inorganic layered film La is not present at the end edge Eb on the terminal side. Therefore, since the residual layer Lb is provided at a certain distance separated from the end edge Eb on the terminal side, it is possible to suppress the occurrence of a crack in the residual layer Lb at the end edge Eb on the terminal side.

In addition, according to the organic EL display device 30d of the present embodiment, since the layered film 32 is not present at the end edge Eb on the terminal side, the occurrence of a crack of the layered film 32 at the end edge Eb on the terminal side can be suppressed.

Furthermore, according to the organic EL display device 30d of the present embodiment, thick portions and thin portions are formed in the layered film 32 provided to cover the edge portions of the plurality of residual layers Lb that are separated from one another. Since the thin portion causes the layered film 32 to be easily separated, even when a crack occurs in the layered film 32, the progress of the crack in the display region D can be suppressed.

Fifth Embodiment

Figure 12:
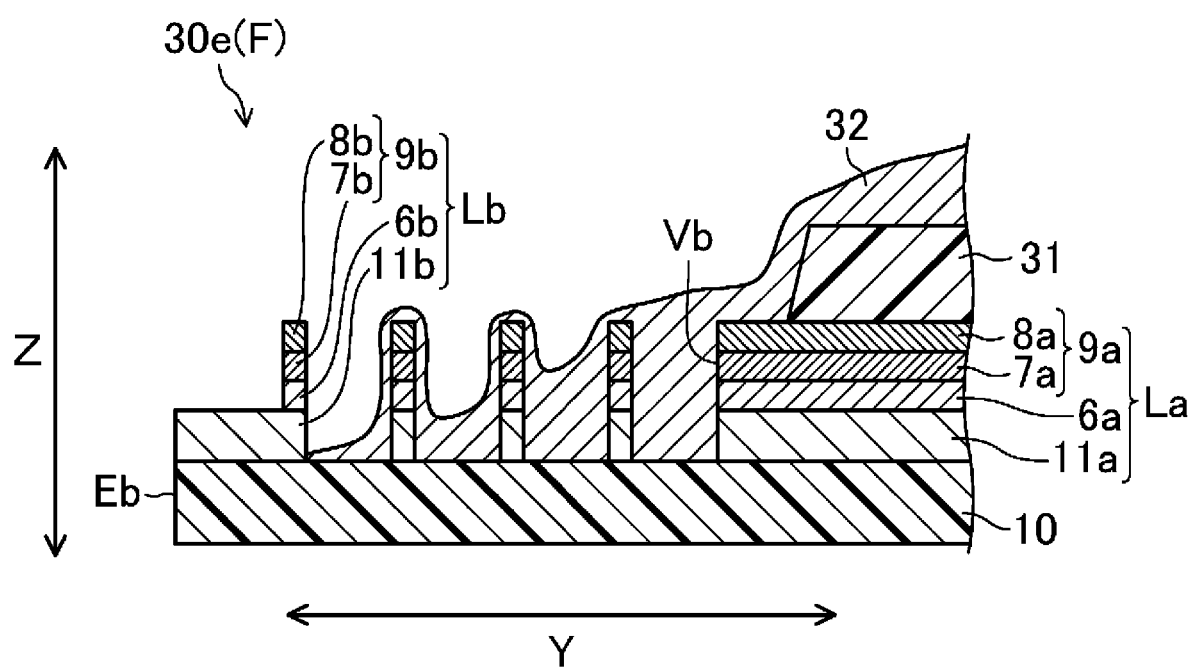
FIG. 12 is a cross-sectional view, which is taken along the line H-H in FIG. 1, illustrating a region between a display region and an end edge not being on a terminal side of an organic EL display device according to a fifth embodiment of the disclosure, and is a diagram corresponding to FIG. 11.

A fifth embodiment of the disclosure will be described below. FIG. 12 is a cross-sectional view, which is taken along the line H-H in FIG. 1, illustrating a region between the end edge Eb on the terminal side and the display region D of an organic EL display device 30e of the present embodiment, and is a diagram corresponding to FIG. 11. Note that an overall configuration, of the organic EL display device 30e, including the display region D, the frame region F, and the like, other than a region between the end edge Eb, Ec, or Ed not being on the terminal side and the display region D, is identical to that of the first embodiment described above, and thus, detailed description thereof will be omitted. Note that constituent portions similar to those in the first embodiment described above are denoted by the identical reference signs, and description thereof will be omitted.

In the fourth embodiment described above, the organic EL display device 30d has been exemplified in which the residual layer Lb is not present at the end edge Eb not being on the terminal side, but in the present embodiment, the organic EL display device 30e is exemplified in which the base coat film 11b is provided on the resin substrate layer 10.

In the organic EL display device 30e, as illustrated in FIG. 12, the base coat film 11b on a side closer to the end edge Eb not being on the terminal side than a plurality of second openings Vb is provided on the resin substrate layer 10 to the end edge Eb not being on the terminal side along the end edge Eb not being on the terminal side. Specifically, only the base coat film 11b of the residual layer Lb of the inorganic layered film La at a position closest to the end edge Eb not being on the terminal side extends to the end edge Eb not being on the terminal side.

Here, in the organic EL display device 30e, as illustrated in FIG. 12, the residual layer Lb including the base coat film 11b provided to the end edge Eb not being on the terminal side is separated from the other residual layers Lb by the second openings Vb.

In addition, in the organic EL display device 30e, the layered film 32 is not provided on the base coat film 11b provided to the end edge Eb not being on the terminal side at the end edge Eb not being on the terminal side. In other words, the layered film 32 is not present at the end edge Eb not being on the terminal side.

Other configurations are similar to those of the organic EL display device 30d according to the fourth embodiment described above. Accordingly, the organic EL display device 30e can obtain similar effects to those of the organic EL display device 30d according to the fourth embodiment.

The organic EL display device 30e of the present embodiment can be manufactured by modifying the pattern shape of the inorganic layered film La in the end edge not being on the terminal side and the display region D in the manufacturing method of the organic EL display device 30a of the first embodiment.

As described above, according to the organic EL display device 30e of the present embodiment, the base coat film 11b is provided on the resin substrate layer 10 at the end edge Eb not being on the terminal side. Since the residual layer Lb including the base coat film 11b is separated from the other residual layers Lb by the second openings Vb, even when a crack occurs in the base coat film 11b at the end edge Eb not being on the terminal side, the progress of the crack into the display region D can be suppressed.

In addition, according to the organic EL display device 30e of the present embodiment, since the layered film 32 is not present on the base coat film 11b at the end edge Eb not being on the terminal side, it is possible to suppress the occurrence of a crack in the layered film 32 at the end edge Eb not being on the terminal side.

Furthermore, according to the organic EL display device 30e of the present embodiment, the base coat film 11b is provided on the resin substrate layer 10 at the end edge Eb not being on the terminal side, and thus, the permeation of moisture, oxygen, and the like from the end edge Eb not being on the terminal side to the interior of the display region D can be suppressed.

Sixth Embodiment

Figure 13:
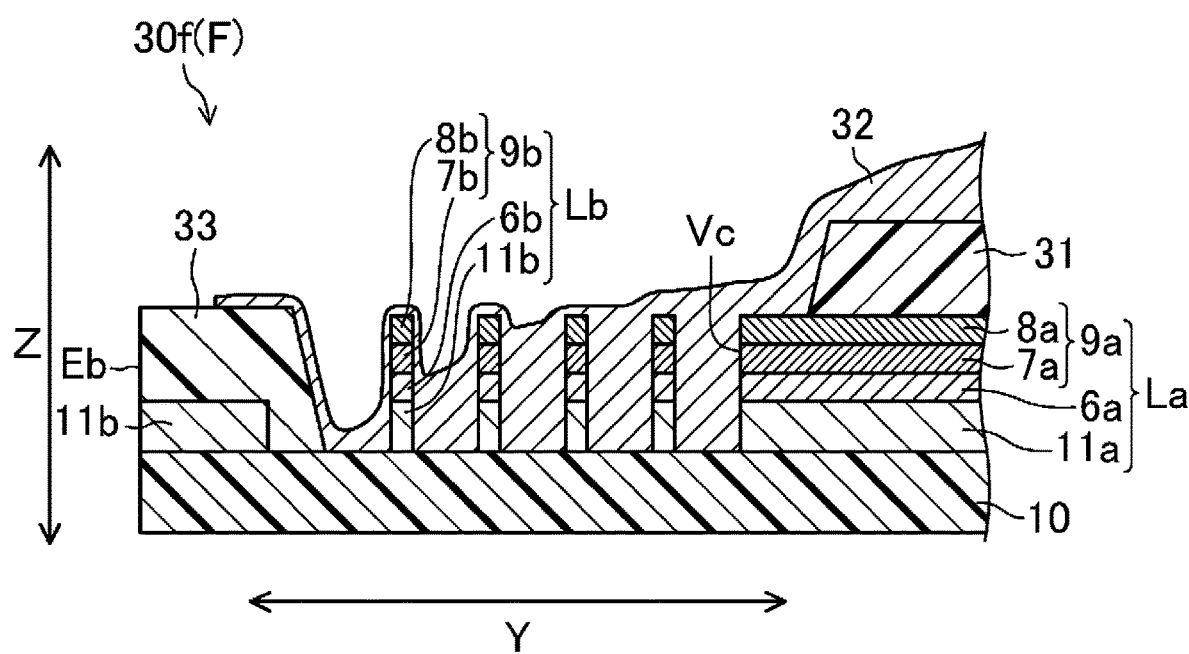
FIG. 13 is a cross-sectional view, which is taken along the line H-H in FIG. 1, illustrating a region between a display region and an end edge not being on a terminal side of an organic EL display device according to a sixth embodiment of the disclosure, and is a diagram corresponding to FIG. 11.

A sixth embodiment of the disclosure will be described below. FIG. 13 is a cross-sectional view, which is taken along the line H-H in FIG. 1, illustrating a region between the end edge Eb not being on the terminal side and the display region D of an organic EL display device 30f of the present embodiment, and is a diagram corresponding to FIG. 11. Note that an overall configuration, of the organic EL display device 30f, including the display region D, the frame region F, and the like, other than a region between the end edge Eb, Ec, or Ed not being on the terminal side and the display region D, is identical to that of the first embodiment described above, and thus, here, detailed description thereof will be omitted. Note that constituent portions similar to those in the first embodiment described above are denoted by the identical reference signs, and description thereof will be omitted.

In the fifth embodiment described above, the organic EL display device 30e has been exemplified in which the base coat film 11b is provided on the resin substrate layer 10 at the end edge Eb not being on the terminal side, but in the present embodiment, the organic EL display device 30f is exemplified in which the upper face of the base coat film 11b is covered with a third flattening film 33.

In the organic EL display device 30f, as illustrated in FIG. 13, the third flattening film 33 is provided on the base coat film 11b provided up to the end edge Eb not being on the terminal side in such a manner as to cover the upper face of the base coat film 11b. Specifically, only the base coat film 11b is formed on the resin substrate layer 10 at the end edge Eb not being on the terminal side, and the upper face of the base coat film 11b is covered with the third flattening film 33.

The third flattening film 33 is formed of, for example, an organic insulating film made of polyimide resin or the like with a thickness of approximately 2 μm.

In addition, in the organic EL display device 30f, the layered film 32 is not provided on the third flattening film 33 at the end edge Eb not being on the terminal side. In other words, the layered film 32 is not present at the end edge Eb not being on the terminal side.

Other configurations are similar to those of the organic EL display device 30e according to the fifth embodiment described above. Accordingly, the organic EL display device 30f can obtain similar effects to those of the organic EL display device 30e of the fifth embodiment.

The organic EL display device 30f of the present embodiment can be manufactured by modifying the pattern shape of the inorganic layered film La in the end edge Eb not being on the terminal side and the display region D in the manufacturing method of the organic EL display device 30a of the first embodiment.

As described above, according to the organic EL display device 30f of the present embodiment, since the third flattening film 33 is provided to cover the upper face of the base coat film 11b at the end edge Eb not being on the terminal side, in addition to the effects of the organic EL display device 30e of the fifth embodiment, the base coat film 11b at the end edge Eb not being on the terminal side is reinforced. Therefore, the occurrence of a crack in the base coat film 11b at the end edge Eb not being on the terminal side can be suppressed.

Seventh Embodiment

Figure 14:
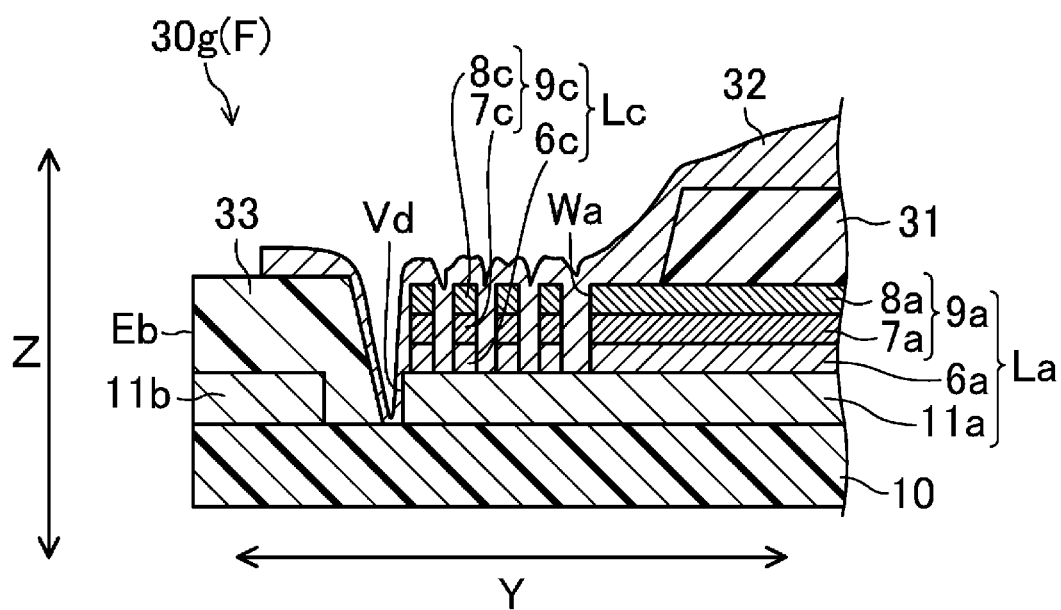
FIG. 14 is a cross-sectional view, which is taken along the line H-H in FIG. 1, illustrating a region between a display region and an end edge not being on a terminal side of an organic EL display device according to a seventh embodiment of the disclosure, and is a diagram corresponding to FIG. 11.

A seventh embodiment of the disclosure will be described below. FIG. 14 is a cross-sectional view, which is taken along the line H-H in FIG. 1, illustrating a region between the end edge Eb not being on the terminal side and the display region D of an organic EL display device 30g of the present embodiment, and is a diagram corresponding to FIG. 11. Note that an overall configuration, of the organic EL display device 30g, including the display region D, the frame region F, and the like, other than a region between the end edge Eb, Ec, or Ed not being on the terminal side and the display region D, is identical to that of the first embodiment described above, and thus, detailed description thereof will be omitted. Note that constituent portions similar to those in the first embodiment described above are denoted by the identical reference signs, and description thereof will be omitted.

In the fourth to sixth embodiments, the organic EL display device 30d, 30e, or 30f respectively provided with the second openings Va to Vc between the end edge Eb not being on the terminal side and the display region D has been exemplified, but in the present embodiment, the organic EL display device 30g further provided with third openings Wa is exemplified.

In the organic EL display device 30g, as illustrated in FIG. 14, between the end edge Eb not being on the terminal side and the display region D, the inorganic layered film La includes, in addition to a second opening Vd, a plurality of third openings Wa that is separated from one another and that penetrates a gate insulating film 6c and an interlayer insulating film 9c other than the base coat film 11a to cause at least a part of the upper face of the base coat film 11a to be exposed.

Specifically, the plurality of third openings Wa that is not provided with the gate insulating film 6c and the interlayer insulating film 9c, together with the second opening portion Vd, is formed between the end edge Eb not being on the terminal side and the display region D. As illustrated in FIG. 14, the third opening Wa is formed by penetrating the gate insulating film 6c and the interlayer insulating film 9c, other than the base coat film 11a, in a thickness direction Z thereof.

As described above, in the third opening Wa, the resin substrate layer 10 is not exposed, and the upper face of the resin substrate layer 10 is covered with the base coat film 11a. In other words, the base coat film 11a is provided on the resin substrate layer 10 in the third opening Wa.

Additionally, in the organic EL display device 30g, as illustrated in FIG. 14, a plurality of the residual layers Lc of the inorganic layered film La each of which includes the gate insulating film 6c and the interlayer insulating film 9c is provided in a slit shape along the end edge Eb not being on the terminal side between the third openings Wa adjacent to one another among the plurality of third openings Wa.

In other words, as illustrated in FIG. 14, in the organic EL display device 30g, not only the base coat film 11b at the end edge Eb not being on the terminal side is separated from the base coat film 11a by the second opening Vd, but also the gate insulating films 6c and the interlayer insulating films 9c of the residual layers Lc are separated from the gate insulating film 6a and the interlayer insulating film 9a of the inorganic layered film La by the plurality of third openings Wa.

On the other hand, the third opening Wa on a side closer to the end edge Eb not being on the terminal side than the second opening Vd is provided along the end edge Eb not being on the terminal side to the end edge Eb not being on the terminal side. In other words, the base coat film 11b is formed on the resin substrate layer 10 at the end edge Eb not being on the terminal side, and the upper face of the base coat film 11b is exposed. Furthermore, the third flattening film 33 is provided, on the base coat film 11b exposed from the third opening Wa, along the end edge Eb not being on the terminal side to the end edge Eb not being on the terminal side in such a manner as to cover the upper face of the base coat film 11b.

The layered film 32 is provided to cover the upper faces of the resin substrate layer 10 and the third flattening film 33, the edge portions of the second opening Vd and the third openings Wa, the inorganic layered film La, the residual layers Lc, and the second flattening film 31.

In this manner, the layered film 32 is provided to cover the edge portions of the plurality of residual layers Lc separated from one another, and thus, thick portions and thin portions are formed in the layered film 32. Since the thin portion causes the layered film 32 to be easily separated, even when a crack occurs in the layered film 32 at the end edge Eb not being on the terminal side, the progress of the crack into the display region D can be suppressed.

Note that the second flattening film 31 is provided on the inorganic layered film La on a side closer to the display region D than the plurality of third openings Wa.

Other configurations are similar to those of the organic EL display device 30f according to the sixth embodiment described above. Accordingly, the organic EL display device 30g can obtain similar effects to those of the organic EL display device 30f of the sixth embodiment.

The organic EL display device 30g of the present embodiment can be manufactured by modifying the pattern shape of the inorganic layered film La in the end edge Eb not being on the terminal side and the display region D in the manufacturing method of the organic EL display device 30a of the first embodiment described above.

As described above, according to the organic EL display device 30g of the present embodiment, in addition to the effects of the organic EL display device 30f of the sixth embodiment described above, the base coat film 11a is provided on the resin substrate layer 10 in the third openings Wa, and thus, the permeation of moisture, oxygen, and the like to the interior of the display region D can be further suppressed.

In addition, according to the organic EL display device 30g of the present embodiment, thick portions and thin portions are formed in the layered film 32 provided to cover the edge portions of the plurality of residual layers Lc separated from one another. Since the thin portion causes the layered film 32 to be easily separated, even when a crack occurs in the layered film 32, the progress of the crack in the display region D can be suppressed.

Eighth Embodiment

Figure 15:
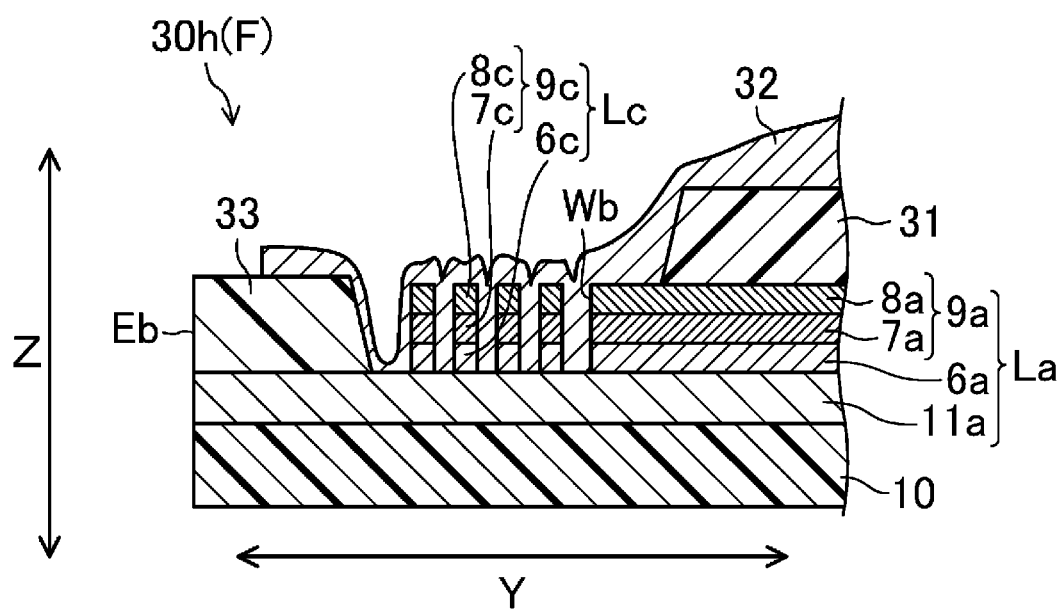
FIG. 15 is a cross-sectional view, which is taken along the line H-H in FIG. 1, illustrating a region between a display region and an end edge not being on a terminal side of an organic EL display device according to an eighth embodiment of the disclosure, and is a diagram corresponding to FIG. 11.

An eighth embodiment of the disclosure will be described below. FIG. 15 is a cross-sectional view, which is taken along the line H-H in FIG. 1, illustrating a region between the end edge Eb not being on the terminal side and the display region D of an organic EL display device 30h of the present embodiment, and is a diagram corresponding to FIG. 11. Note that an overall configuration, of the organic EL display device 30h, including the display region D, the frame region F, and the like, other than a region between the end edge Eb, Ec, or Ed not being on the terminal side and the display region D, is identical to that of the first embodiment described above, and thus, detailed description thereof will be omitted. Note that constituent portions similar to those in the first embodiment described above are denoted by the identical reference signs, and description thereof will be omitted.

In the fourth to seventh embodiments, the organic EL display device 30d, 30e, 30f, or 30g provided with the second openings Va to Vd between the end edge Eb not being on the terminal side and the display region D has been exemplified, but in the present embodiment, the organic EL display device 30h provided with only the third openings is exemplified.

In the organic EL display device 30h, as illustrated in FIG. 15, a plurality of third openings Wb is provided in the inorganic layered film La between the end edge Eb not being on the terminal side and the display region D.

Specifically, no second opening is provided in the inorganic layered film La between the end edge Eb not being on the terminal side and the display region D. In other words, the base coat film 11a is provided over the entirety of the resin substrate layer 10 between the end edge Eb not being on the terminal side and the display region D.

Furthermore, in the organic EL display device 30h, the third opening Wb on a side of the end edge Eb not being on the terminal side is provided along the end edge Eb not being on the terminal to the end edge Eb not being on the terminal. In other words, the upper face of the base coat film 11a is exposed at the end edge Eb not being on the terminal side. Furthermore, the third flattening film 33 is provided, on the base coat film 11a exposed from the third opening Wb, along the end edge Eb not being on the terminal side to the end edge Eb not being on the terminal side in such a manner as to cover the upper face of the base coat film 11a.

The layered film 32 is provided to cover the resin substrate layer 10, the upper faces of the base coat film 11a and the third flattening film 33, the edge portions of the third openings Wb, the inorganic layered film La, the residual layers Lc, and the second flattening film 31.

Other configurations are similar to those of the organic EL display device 30g according to the seventh embodiment described above.

The organic EL display device 30h of the present embodiment can be manufactured by modifying the pattern shape of the inorganic layered film La in the end edge Eb not being on the terminal side and the display region D in the manufacturing method of the organic EL display device 30a of the first embodiment described above.

As described above, according to the organic EL display device 30h of the present embodiment, the base coat film 11a is provided on the resin substrate layer 10 over the entirety of the resin substrate layer 10, and as a result, the permeation of moisture, oxygen, and the like into the display region D can be further suppressed.

In addition, according to the organic EL display device 30h of the present embodiment, thick portions and thin portions are formed in the layered film 32 provided to cover the edge portions of the plurality of residual layers Lc separated from one another. Since the thin portion causes the layered film 32 to be easily separated, even when a crack occurs in the layered film 32, the progress of the crack in the display region D can be suppressed.

Other Embodiments

In the first to sixth embodiments, the inorganic layered film La is configured of four layers in which the gate insulating film 6a, the first interlayer insulating film 7a, and the second interlayer insulating film 8a are layered in this order on the base coat film 11a, but the inorganic layered film La may be configured of a single layer of the base coat film 11a, or may be configured of two layers of the base coat film 11a and the gate insulating film 6a.

In the fourth to sixth embodiments, the residual layers Lb of the inorganic layered film La are configured of four layers in which the gate insulating film 6b, the first interlayer insulating film 7b, and the second interlayer insulating film 8b are layered in this order on the base coat film 11b, but the residual layers Lb may be configured of a single layer of the base coat film 11b, or may be configured of two layers of the base coat film 11b and the gate insulating film 6b.

In the seventh to eighth embodiments, the inorganic layered film La and the residual layers Lc thereof are configured of four layers in which the gate insulating film 6, the first interlayer insulating film 7, and the second interlayer insulating film 8 are layered in this order on the base coat film 11, but may be configured of two layers of the base coat film 11 and the gate insulating film 6.

In each of the embodiments described above, the organic EL layer having a five-layered structure including the hole injection layer, the hole transport layer, the light-emitting layer, the electron transport layer, and the electron injection layer is exemplified, but the organic EL layer may have a three-layered structure including a hole injection-cum-transport layer, a light-emitting layer, and an electron transport-cum-injection layer.

In addition, in each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In addition, in each of the embodiments described above, the organic EL display device including an element substrate in which the electrode of the TFT connected to the first electrode serves as the drain electrode is exemplified. The disclosure is also applicable to an organic EL display device including an element substrate in which the electrode of the TFT connected to the first electrode is referred to as the source electrode.

In addition, in each of the embodiments described above, the organic EL display device is exemplified and described as a display device. The disclosure is also applicable to a display device including a plurality of light-emitting elements that is driven by an electrical current. For example, the disclosure is applicable to a display device including Quantum-dot Light Emitting Diodes (QLEDs) that are light-emitting elements using a quantum dot-containing layer.

As described above, the disclosure is useful for a flexible display device.

The invention claimed is:
1. A display device, comprising:
a resin substrate;
a TFT (thin film transistor) layer provided on the resin substrate and including a plurality of an inorganic insulating films layered on the resin substrate;
a light-emitting element configuring a display region provided on the TFT layer;
a frame region provided around the display region; and
a terminal portion provided at a left end portion of the frame region and arrayed with a plurality of terminals,
wherein the frame region is provided with a plurality of lead wiring lines extending in parallel to each other in a direction intersecting an end edge on a terminal side of the resin substrate along the terminal portion, the plurality of lead wiring lines being electrically connected to the plurality of terminals respectively,
a bending portion is provided between the display region and the terminal portion,
between the end edge on the terminal side and the terminal portion, the plurality of the inorganic insulating films is provided with a first opening penetrating the plurality of the inorganic insulating films and causing at least a part of an upper face of the resin substrate to be exposed,
a first filling layer is provided in an interior of the first opening to cover an edge portion of the first opening,
the plurality of lead wiring lines is provided near at least the end edge on the terminal side and is in contact with upper faces of the plurality of the inorganic insulating films and the first filling layer, a first flattening film is provided on the plurality of lead wiring lines, the first filling layer is provided to cover an end surface on the terminal side of the plurality of the inorganic insulating films, such that the plurality of the inorganic insulating films is not present on the end edge on the terminal side, and an end surface of the plurality of lead wiring lines is exposed, at the end edge of the terminal side, from the first filling layer and the first flattening film.

2. The display device according to claim 1, wherein the bending portion extends in one direction, the plurality of the inorganic insulating films is provided with a slit, including the bending portion in a plan view, penetrating the plurality of the inorganic insulating films and causing the upper face of the resin substrate to be exposed, and in an interior of the slit, a second filling layer formed of an identical material in an identical layer to the first filling layer is provided to cover an edge portion of the slit.

3. The display device according to claim 2, wherein a plurality of display wiring lines is provided in the display region, and extends in parallel to each other in a direction intersecting an extending direction of the bending portion, in the bending portion, a plurality of frame wiring lines is provided to extend in parallel to one another in a direction intersecting the extending direction of the bending portion, and to be electrically connected to the plurality of terminals and the plurality of display wiring lines respectively, and the plurality of frame wiring lines is provided in an identical layer by using an identical material to the plurality of lead wiring lines.

4. The display device according to claim 1, wherein the first flattening film is in contact with the plurality of lead wiring lines.

5. The display device according to claim 4, wherein the first flattening film is provided in an identical layer by using an identical material to an edge cover included in the light-emitting element.

6. The display device according to claim 1, wherein between at least one end edge not being on the terminal side other than the end edge on the terminal side and the display region, the plurality of the inorganic insulating films is provided with a plurality of second openings separated from one another, penetrating the plurality of the inorganic insulating films and causing at least the part of the upper face of the resin substrate to be exposed, among the plurality of second openings, the second opening on a side of the end edge not being on the terminal side is provided along an extension direction of the end edge not being on the terminal side to the end edge not being on the terminal side, the extension direction extending in a direction in which the plurality of lead wiring lines extends, and a second flattening film is provided on the plurality of the inorganic insulating films on a side closer to the display region than the plurality of second openings.

7. The display device according to claim 1, wherein the resin substrate is formed of polyimide resin.

8. The display device according to claim 1, wherein each of the plurality of lead wiring lines is formed of an identical material to a source line provided on the display region.

9. The display device according to claim 1, wherein each of the plurality of lead wiring lines is formed of an identical material in an identical layer to the plurality of terminals.

10. The display device according to claim 1, wherein the light-emitting element is an organic EL element.

11. The display device according to claim 1, wherein the plurality of lead wiring lines is provided to a side surface on the terminal side of the end edge on the terminal side.

* * * * *